United States Patent [19]
Landherr et al.

[11] Patent Number: 6,025,753
[45] Date of Patent: Feb. 15, 2000

[54] METHOD AND APPARATUS FOR AMPLIFYING A SIGNAL

[75] Inventors: Michael Landherr, Cary; Armin Klomsdorf, Spring Grove; Mark A. Pennock, Lake Zurich, all of Ill.

[73] Assignee: Motorola, Inc., Schaumburg, Ill.

[21] Appl. No.: 08/890,819

[22] Filed: Jul. 11, 1997

[51] Int. Cl.[7] .................................................. H03G 3/30
[52] U.S. Cl. ............................ 330/285; 330/133; 330/134
[58] Field of Search ................................... 330/128, 129, 330/133, 134, 277, 279, 285, 297; 455/127

[56] References Cited

U.S. PATENT DOCUMENTS

| | | |
|---|---|---|
| 4,500,848 | 2/1985 | Marchand et al. ......................... 330/285 |
| 4,510,460 | 4/1985 | Tamura ..................................... 330/285 |
| 4,602,218 | 7/1986 | Vilmur et al. . |
| 5,029,298 | 7/1991 | Chiba et al. . |
| 5,045,672 | 9/1991 | Youn . |
| 5,126,688 | 6/1992 | Nakanishi et al. . |
| 5,276,912 | 1/1994 | Siwiak et al. . |
| 5,278,517 | 1/1994 | Fujita . |
| 5,278,997 | 1/1994 | Martin . |
| 5,589,796 | 12/1996 | Alberth, Jr. et al. ............... 330/285 X |
| 5,646,577 | 7/1997 | Ishikura .................................. 330/279 |

*Primary Examiner*—Steven J. Mottola
*Attorney, Agent, or Firm*—Michael C. Soldner; John J. King

[57] ABSTRACT

According to the method and apparatus of the present disclosure, dual drain control uses a variable voltage supply on the drains of a first stage (302) and a second stage (304) to control the output power. In particular, dual drain control having a 1:1 ratio is employed at lower power levels, with single drain control at higher power levels. Such drain control could be employed by directly varying (1008, 1010) the voltage on the drains of the power amplifier, such as with signals from a microprocessor, or by a specific circuit (203) to generate the drain voltages based upon a control voltage.

28 Claims, 7 Drawing Sheets

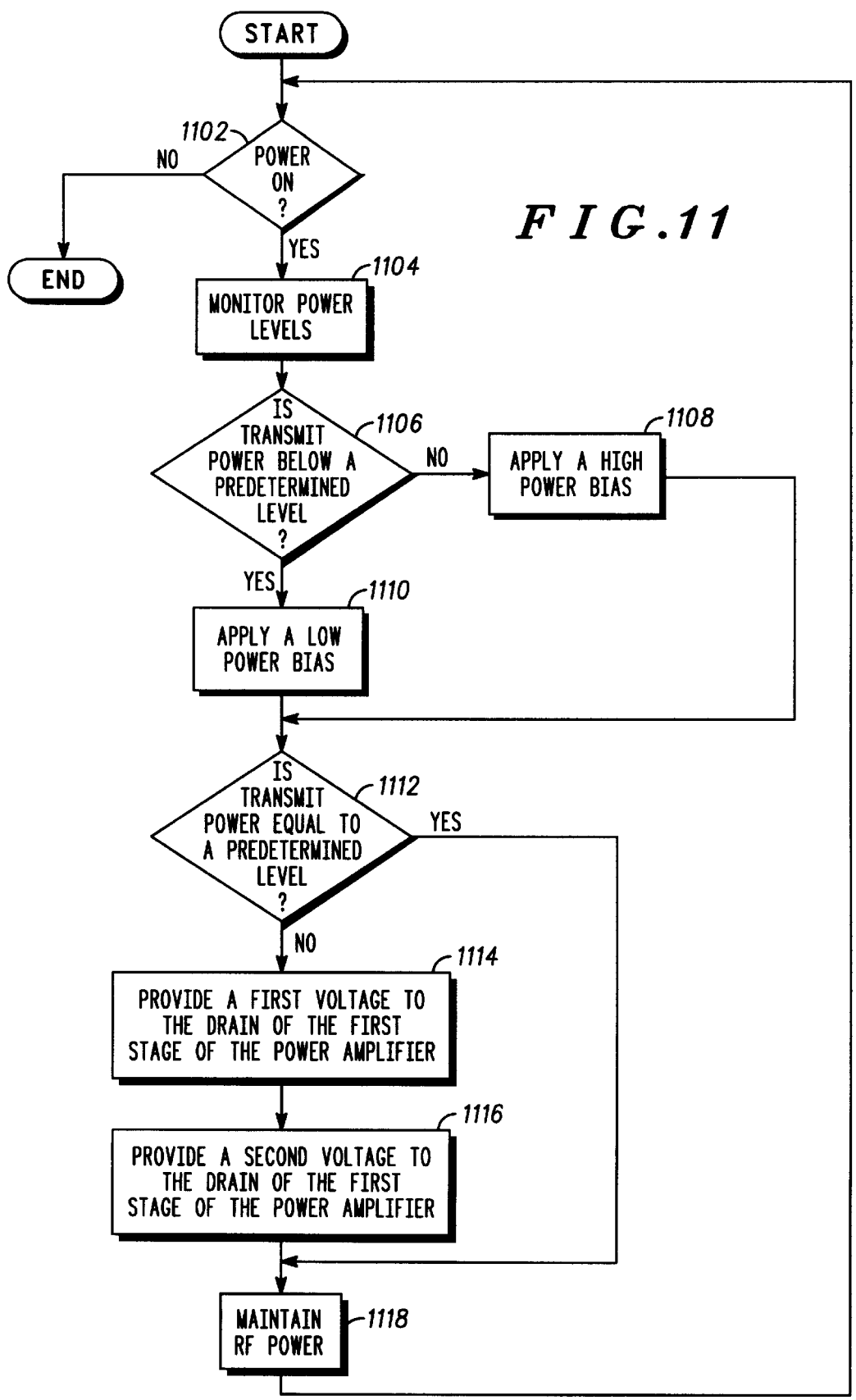

METHOD AND APPARATUS FOR AMPLIFYING A SIGNAL

FIELD OF THE INVENTION

This application is related to amplifiers, and more particularly to a method and apparatus for amplifying a signal.

BACKGROUND OF THE INVENTION

A power amplifier (PA) is used in a wireless communication device such as a cellular radiotelephone to amplify radio frequency (RF) signals so that the device can communicate with a fixed site transceiver. Considerable power in a wireless communication device is dissipated in the power amplifier. For example, in a portable cellular radiotelephone, a significant percent of the power dissipation is in the power amplifier. Efficiencies of a power amplifier significantly depend upon variations in output power. One problem associated with designing a high-efficiency power amplifier is adequately compensating for these output power variations. Improving the power amplifier efficiency is essential to increasing the operating time for a given battery of the wireless communication device.

Wireless communication devices typically transmit radio frequency signals at a plurality of power levels. For example, some cellular radiotelephones require seven 4 dB steps in output power of the radio transmitter. However, newer cellular telephone systems have required additional power levels. The efficiency of the power amplifier significantly varies over the output power range. Because current drain efficiency of the power amplifier is most affected at a higher output power, the power amplifier is typically designed to maximize efficiency at higher output power levels. One technique to improve power efficiency requires switching the quiescent current of the power amplifier in response to a power amplifier output step change. At the lowest power step, the power amplifier is normally in class A mode of operation. By changing the bias conditions of the power amplifier at the lower steps, the power amplifier could be kept in class A/B mode with a corresponding improvement in efficiency.

In a conventional two-stage amplifier, a variable voltage supply on the first stage drain controls the output power of the amplifier via adjusting the gain of the first stage, commonly called single drain control. The second stage is biased class A/B and has constant Vds and Vgs. This control configuration provides optimum efficiency for high output power levels only. At lower output power levels, the amplifier current drain is high due to the total current drain asymptotically approaching the second stage quiescent current. In addition, the dynamic range in this configuration is limited to 25 dB, inadequate for achieving certain power levels required in a system having a wider dynamic range, such as power levels 8, 9, and 10 as set forth in the IS-91 specification published by the Electronics Industry Association/Telecommunications Industry Association located at 2001 Pennsylvania Ave., N.W. Washington, D.C. 20006.

Other conventional devices using dual gate control use fixed supply voltages at the drains of both stages. Varying Vgs of both stages controls output power by changing the gain of each stage. While dual gate control may provide a wider dynamic range, the MESFETs are typically operated in the pinchoff region to provide the dynamic range, compromising stability of the amplifier at low power levels.

Accordingly, there is a need for a method and apparatus for amplifying a radio frequency signal with greater efficiency over a wide dynamic range.

BRIEF DESCRIPTION OF THE DRAWINGS

FIG. 11 is a flow chart showing a method for amplifying a signal according to an alternate embodiment of the present invention.

DESCRIPTION OF THE PREFERRED EMBODIMENT

According to the method and apparatus set forth in the present disclosure, dual drain control uses a variable voltage supply on the drains of the first and second stages to control the output power. Dual drain control provides the dynamic range necessary for the transmission of low power levels. While dual drain control having a 1:1 ratio (i.e. ratio of voltages applied to the drains) is efficient at low power levels, dual drain control having a 1:1 ratio is generally less efficient at high power levels than single drain control. Accordingly, dual drain control having a 1:1 ratio at lower power levels, with single drain control at higher power levels is preferably employed. Such dual drain control could be employed by directly varying the voltage on the drains of the power amplifier, such as with signals from a microprocessor. Alternatively, specific circuits could be employed to generate the drain voltages based upon a control voltage. Such circuits using a control voltage would reduce the number of control signals from the microprocessor.

Figure 1:
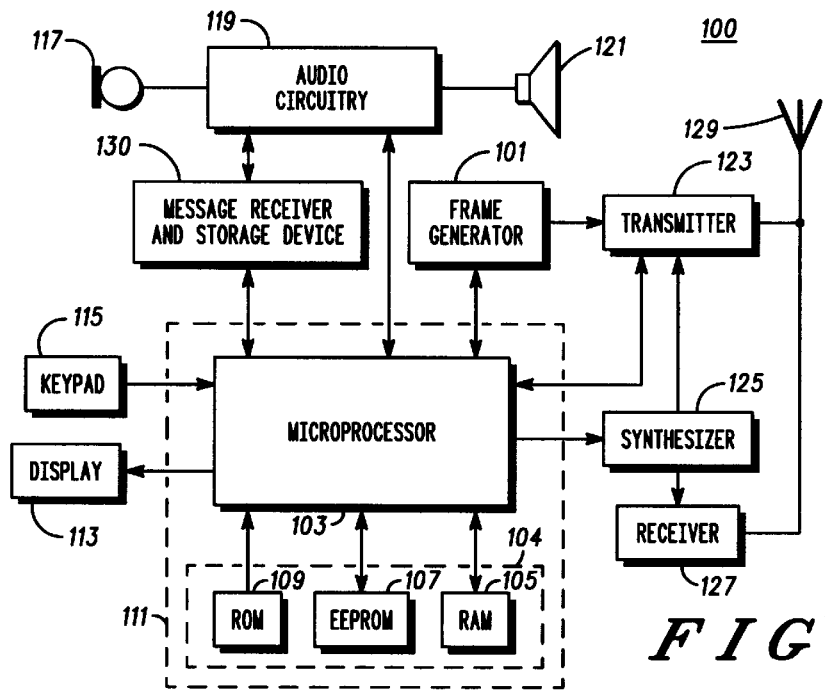
FIG. 1 is a block diagram of a wireless communication device, such as a cellular radio telephone, according to the present invention.

Turning first to FIG. 1, a block diagram of a wireless communication device such as a cellular radiotelephone incorporating the present invention is shown. In the preferred embodiment, a frame generator ASIC 101, such as a CMOS ASIC available from Motorola, Inc. and a microprocessor 103, such as a 68HC11 microprocessor also available from Motorola, Inc., combine to generate the necessary communication protocol for operating in a cellular system. Microprocessor 103 uses memory 104 comprising RAM 105, EEPROM 107, and ROM 109, preferably consolidated in one package 111, to execute the steps necessary to generate the protocol and to perform other functions for the communication unit, such as writing to a display 113, accepting information from a keypad 115, controlling a frequency synthesizer 125, or performing steps necessary to amplify a signal according to the method of the present invention. ASIC 101 processes audio transformed by audio circuitry 119 from a microphone 117 and to a speaker 121.

A transceiver processes the radio frequency signals. In particular, a transmitter 123 transmits through an antenna 129 using carrier frequencies produced by a frequency synthesizer 125. Information received by the communication device's antenna 129 enters receiver 127 which demodulates the symbols comprising the message frame using the carrier frequencies from frequency synthesizer 125. The communication device may optionally include a message receiver and storage device 130 including digital signal processing means. The message receiver and storage device could be, for example, a digital answering machine or a paging receiver.

Figure 2:
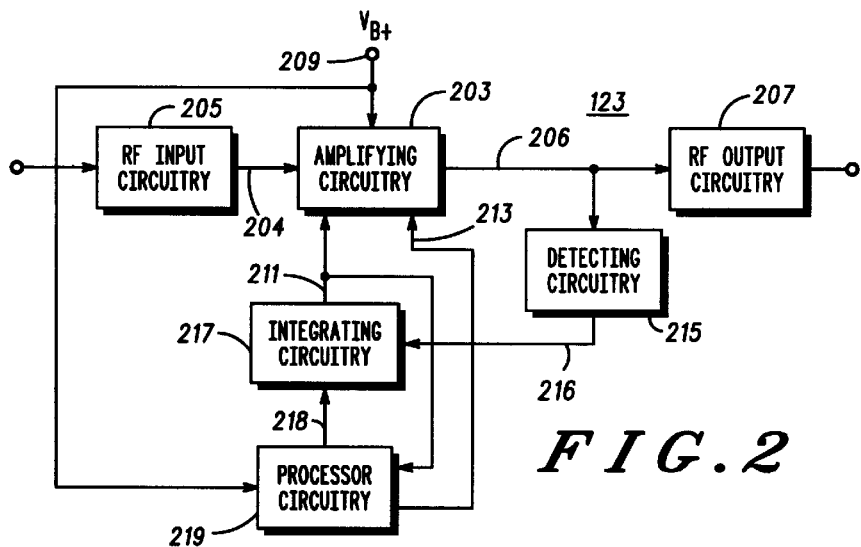
FIG. 2 is a block diagram of a transmitter circuit 123 of the block diagram of FIG. 1.

Turning now to FIG. 2, a block diagram illustrates the transmitter 123 having amplifying circuitry 203 and corresponding control circuitry comprising detecting circuitry 215, integrating circuitry 217, and processor circuitry 219. Amplifying circuitry 203 preferably contains two amplifying elements, preferably gallium arsenide FETs (Field Effect Transistors) to receive an input signal and generate an output signal which is an amplified version of the input signal. A power source 209, such as a battery, generates a battery voltage signal denoted by $V_{B+}$ and supplies power to the amplifying circuitry 203. Although the battery comprising the power source 209 may be fabricated to provide a particular battery voltage signal, such as 3.0 volts, 4.8 volts or 6.0 volts, when nominally charged, the amplifying circuitry 203 must be capable of functioning when the battery has significantly discharged to a voltage lower than the particular voltage.

Amplifying circuitry 203 amplifies an RF input signal 204 (typically containing voice and data to be transmitted) provided by RF input circuitry 205 into an amplified RF output signal 206. The RF input signal 204 is amplified such that the amount of power in the RF output signal 206 corresponds to one of a plurality of predetermined power output levels which define the operation of the transmitter 123. The amplifying circuitry 203 subsequently outputs the RF output signal 206 to RF output circuitry 207.

The block diagram of FIG. 2 contains an output power control loop to maximize the efficiency of the amplifying circuitry 203. The power control loop is generally controlled by processor circuitry 219. Although transmitter 123 utilizes the integral processor circuitry 219, the processor-dependent functionality of the transmitter 123 could be solely provided by a central processor for the device, such as microprocessor 103 shown in FIG. 1.

The output power control loop maintains the amount of power in the RF output signal 206 at a constant level by varying the gain of amplification of the amplifying circuitry 203 via an amplifier control signal 211. The output power control loop consists of detecting circuitry 215, processor circuitry 219, and integrating circuitry 217 and functions while transmitter 123 is in operation.

Detecting circuitry 215 is coupled between the amplifying circuitry 203 and RF output circuitry 207 as well as to the integrating circuitry 217 to detect the power level of the RF output signal 206. Upon detection, the detecting circuitry 215 generates and outputs a detected power output signal 216 to the integrating circuitry 217. The detected power output signal 216 corresponds to the amount of power in the RF output signal 206.

Processor circuitry 219 is coupled to the integrating circuitry 217 to provide a power output control signal 218. The power output control signal 218 contains a predetermined value defining the amount of power that should be in the RF output signal 206. The predetermined value is one of a plurality of phasing values stored in a memory of the processor circuitry 219 during manufacture.

Integrating circuitry 217 compares the detected power output signal 216 and power output control signal 218 to ensure that the amount of power in RF output signal 206 is correct. Integrating circuitry 217 accordingly adjusts the magnitude of amplifier control signal 211 to ensure that amplifying circuitry 203 provides an accurate and constant RF output signal 206.

Figure 3:
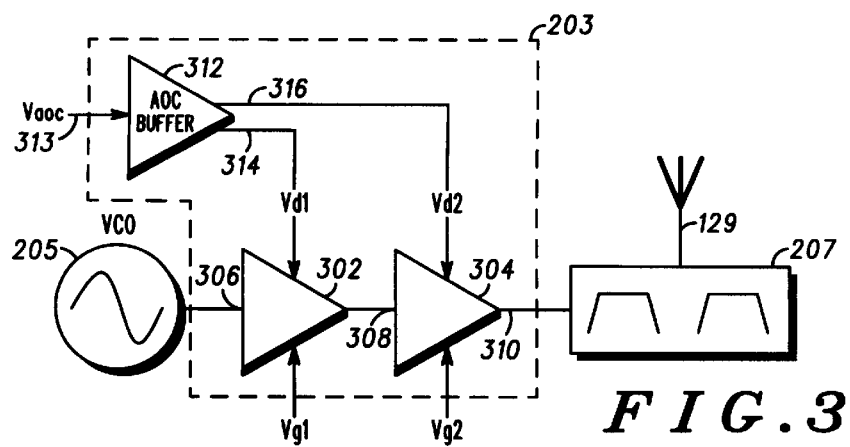
FIG. 3 is a block diagram of amplifying circuitry 203 according to the present invention.

Turning now to FIG. 3, a block diagram shows the amplifying circuitry 203 in more detail. In particular, amplifying circuitry 203 includes a first stage 302 and a second stage 304 for amplifying a signal from RF input circuitry 205, such as a voltage control oscillator (VCO), to RF output circuitry 207. First stage amplifier 302 receives the output of the VCO at input 306, and generates a first output signal which is coupled to input 308 of the second stage amplifier. The output of the second stage 310 is coupled RF output circuitry 207, which could be, for example, a duplex filter. Each stage of the amplifier receives a drain voltage and a gate voltage to control the amplifier.

Although the drain and gate voltages could be applied directly to the amplifier from a control circuit such as a microprocessor, amplifying circuitry 203 also preferably includes an automatic output control (AOC) buffer 312. The AOC buffer receives a power control signal $V_{AOC}$ at an input 313. AOC buffer 312 generates drain voltage control signals $V_{d1}$ and $V_{d2}$ at outputs 314 and 316, respectively. As will be described in more detail in reference to the remaining figures, the two drain control voltages and the gate control voltage of the second stage may be used to reduce current and maximize efficiency of the power amplifier.

Figure 4:
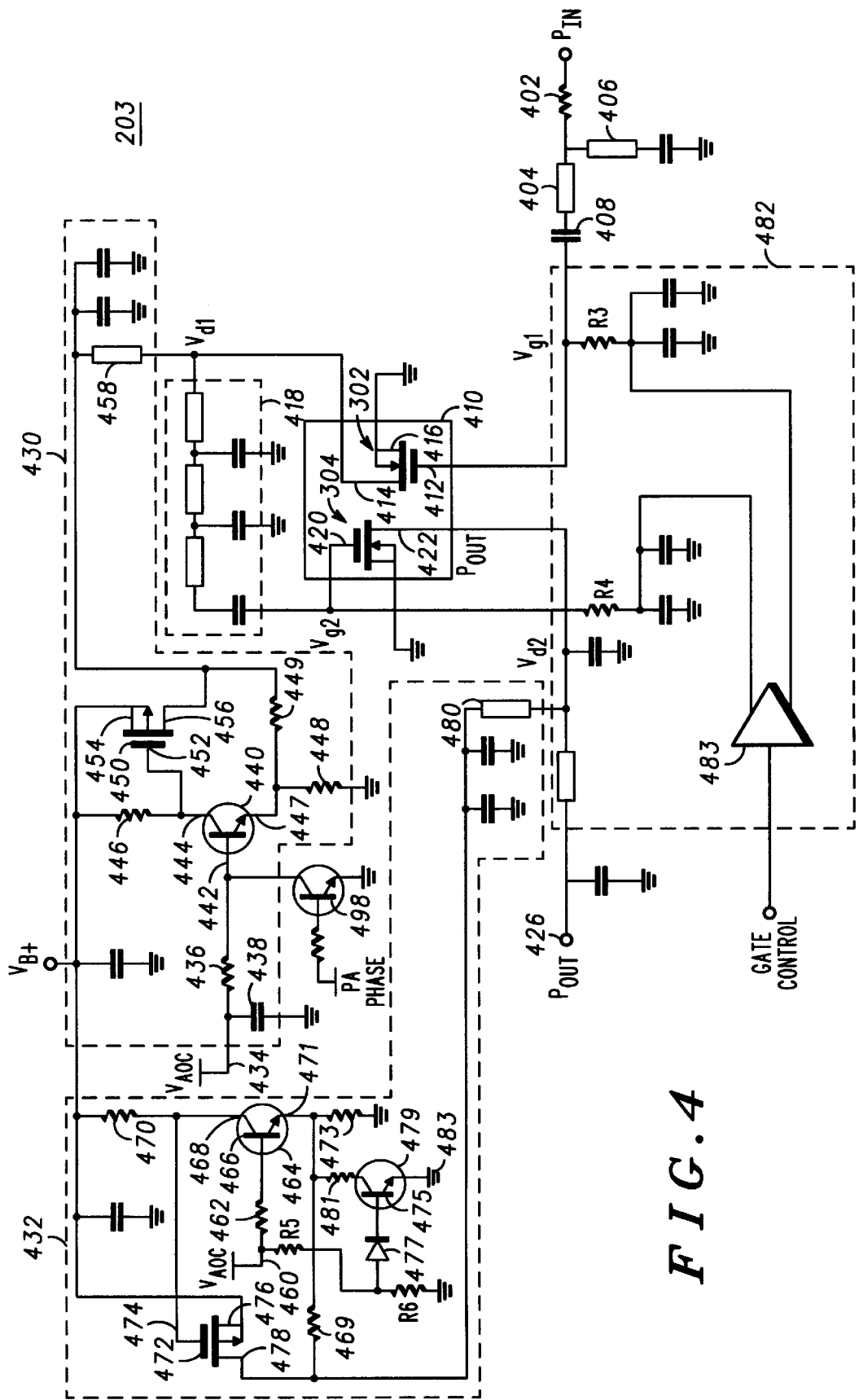
FIG. 4 is a more detailed circuit diagram of amplifying circuitry 203.

Turning now to FIG. 4, a circuit diagram of the amplifying circuitry 203 is shown. In particular, the input power signal $P_{IN}$ is coupled to resistor 402 and a transmission line network comprising transmission lines 404 and 406. The input signal is coupled by a capacitor 408 to a power amplifier 410 comprising the first stage amplifier 302 and a second stage amplifier 304. Both stages of power amplifier 410 preferably comprise N-channel depletion devices. However, other devices could be incorporated according to the present invention. The input signal is coupled to power amplifier 410 at a gate 412 of the first stage amplifier. The drain 414 of the transistor is then coupled to the second stage of the amplifier by a transmission circuit 418. The source and substrate of amplifier 302 are coupled to ground. The power signal is then coupled to gate 420 of the second stage amplifier 304 of power amplifier 410. The drain 422 is coupled to an output 426 ($P_{out}$) which provides the amplified power signal to RF output circuitry 207. The source 424 and substrate of amplifier 304 are also coupled to ground.

AOC buffer 312 is also shown in more detail in FIG. 4 and generally comprises a first AOC buffer 430 for generating $V_{d1}$ and a second AOC buffer 432 for generating $V_{d2}$. As will be described in more detail in reference to FIG. 5, the voltage on the drain $V_{d1}$ of the first stage of the amplifier is generated to maximize the efficiency of the amplifier. AOC buffer 430 receives a power control signal $V_{AOC}$ at an input 434 which is coupled by a resistor 436 to a control transistor 440 at a base 442. The power control signal $V_{AOC}$ is preferably a linear voltage signal. As $V_{AOC}$ increases, the output voltages at both drains will increase monotonically. The collector 444 is coupled to $V_{B+}$ by a resistor 446 while the emitter 447 is coupled to a resistor network including a shunt resistor 448 and a series resistor 449. The selection of values for the shunt resistor and the series resistor will determine the gain of the particular stage of the amplifier, and therefore the ratio of the gains of the first and second stages. The collector of control transistor 440 is also coupled to a transistor 450, which is preferably a P-channel enhancement type MOSFET transistor, at a base 452. The source 454 and substrate are coupled to $V_{B+}$, while the drain is coupled to a transmission line 458. Finally, an additional transistor 498 is coupled to the base of transistor 440 to shut off the first stage drain during bias phasing to eliminate oscillation in the second stage.

The second AOC buffer 432 also receives the power control signal $V_{AOC}$ at an input 460 which is coupled by a resistor 462 to a control transistor 464 at a base 466. The collector 468 is coupled to $V_{B+}$ by a resistor 470. The emitter 471 is coupled to a series resistor 469 and a shunt resistor 473. The collector 468 is also coupled to a transistor 472, which is preferably a P-channel enhancement type MOSFET transistor at a gate 474. The source and substrate of transistor 472 are coupled to $V_{B+}$. The drain 478 is coupled to a transmission line 480. $V_{d2}$, which is generated at the output of transmission line 480, will also determine the efficiency of the power amplifier. Preferably transistor 450 and 472 are preferably P-channel enhancement-type MOSFET transistors. However, other transistors could be used according to the present invention. A transistor 475 is also coupled to receive $V_{AOC}$ at its base by way of a diode 477. The collector 479 is coupled to a resistor 481, which is coupled in parallel to shunt resistor 473. As will be described in more detail in reference to FIG. 5, when transistor 475 is biased on, resistor 481 is coupled in parallel with shunt resistor 473, changing the gain of the second stage.

Each control transistor is controlled by the following equation (1):

$$V_d = (V_{AOC} - V_{be}) * ((Rseries + Rshunt)/Rshunt),$$

where $V_d$=Output voltage ($V_{d1}$ for the first stage, $V_{d2}$ for the second stage)

$V_{AOC}$=Input voltage (power control signal, preferably 0 to 2.75 Volts)

$V_{be}$=Base-emitter voltage

Gain=((Rseries+Rshunt)/Rshunt)

Rseries=Series feedback resistor (449 for first stage, 469 for second stage)

Rshunt=Shunt feedback resistor (448 for first stage, 473 for second stage)

Figure 5:
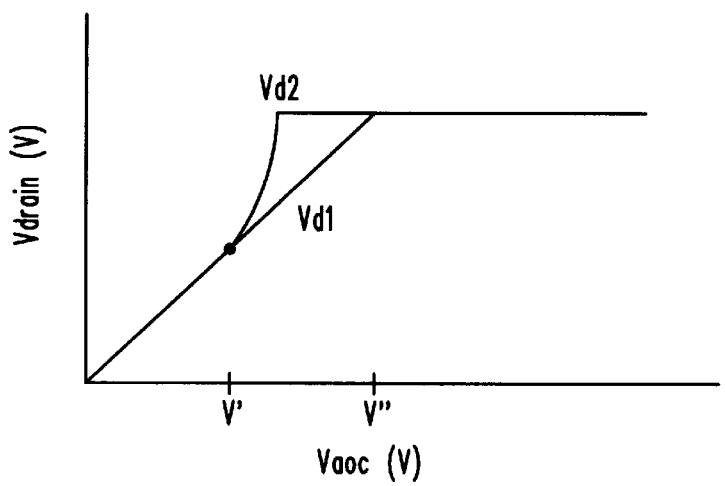
FIG. 5 is a plot showing the drain voltages of the two stage amplifier of FIG. 4 as a function of the power control signal according to the present invention.
Figure 7:
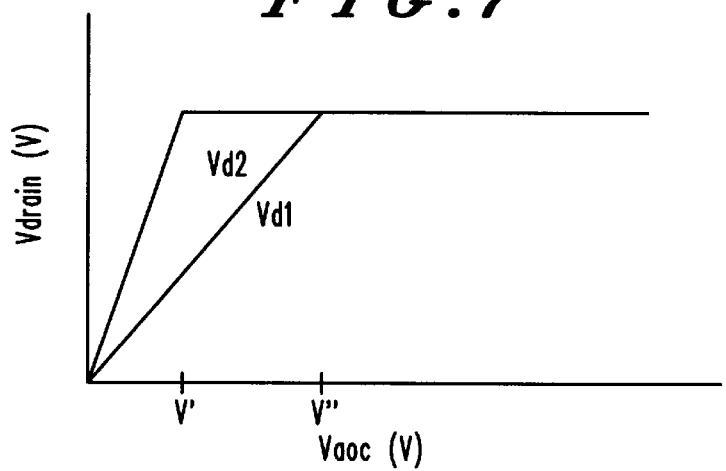
FIG. 7 is a plot showing the drain voltages of the two stage amplifier of FIG. 6 as a function of the power control signal according to the present invention.

A plot in FIG. 5 shows the voltage at the drain for $V_{d1}$ and $V_{d2}$ as a function of the power control voltage $V_{AOC}$. $V_{d1}$ initially tracks $V_{d2}$ until $V_{AOC}$ reaches V'. Accordingly, during lower power levels, the circuit exhibits the efficiency of dual drain control. However, as $V_{AOC}$ increases above V', the threshold of diode 477 (which may be a zenor diode) is exceeded, turning on transistor 475 to couple resistor 481 in parallel with shunt resistor 473 by creating a path to ground for resistor 481. As can be calculated from Equation (1), the gain of the second stage will change, generating a fixed $V_{d2}$. As can be seen from FIG. 5, the circuit exhibits the efficiency of single drain control during high power levels. The series and shunt resistors are selected to generate predetermined gains at the two stages (and therefore a ratio $V_{d1}/V_{d2}$), depending upon a number of factors. V' is determined by the particular characteristics of the PA, such as the current consumption of a single drain control versus dual drain control having a 1:1 voltage ratio. V' is chosen at a point where single drain control becomes more efficient that dual drain control.

Figure 6:
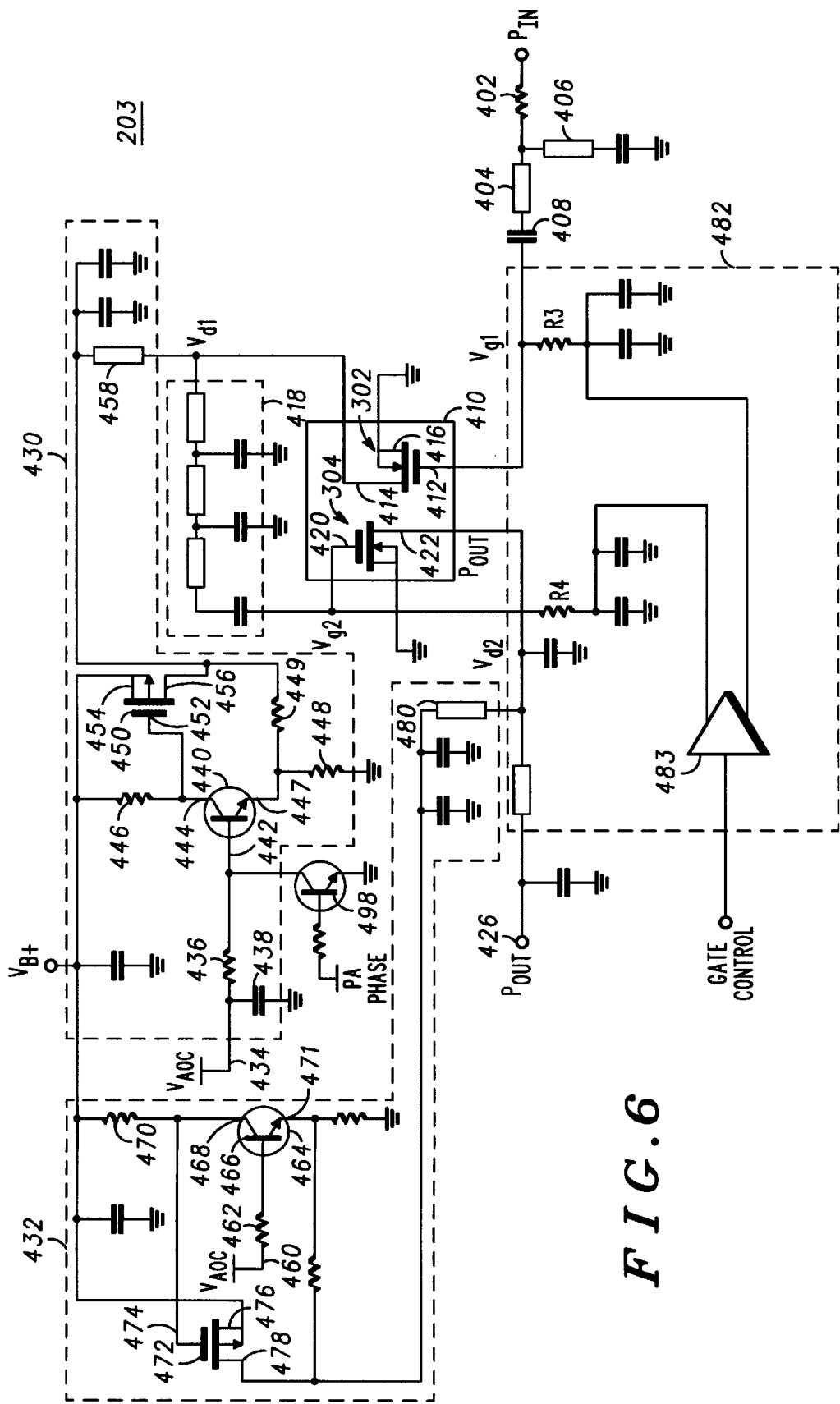
FIG. 6 is a circuit diagram of an alternate embodiment of amplifying circuitry 203.

Turning now to FIG. 6, an alternate embodiment shows a circuit having dual drain control with a lower $V_{d1}/V_{d2}$ ratio, such as a 1:3 ratio. As will be described in more detail, the circuit of FIG. 6 eliminates transistor 475, diode 477 and resistor 481, and employs a gate control circuit 482 to optimize efficiency and stability of the amplifier. Dual drain control having a 1:3 ratio combines the efficiency at the higher power levels from single drain control, with the efficiency at lower power levels of dual drain control with a 1:1 ratio when an alternate bias is applied to the 2nd stage gate to change the quiescent current consumption. As stated earlier, dual drain control is generally efficient at low power levels. In the low power region (such as power levels 4–10 of the IS-91 specification), an alternate low power bias is applied to the gate of the second stage. In particular, a buffer circuit provides a current that can be sourced or sunk by the gates of the PA. As a result, the circuit of FIG. 6 emulates dual drain control having a ratio of 1:1 for $V_{d1}/V_{d2}$.

Figure 9:
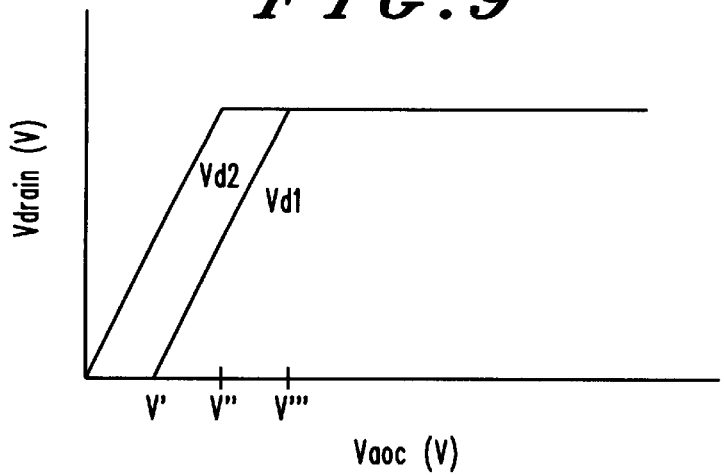
FIG. 9 is a plot showing the drain voltages of the two stage amplifier of FIG. 8 as a function of the power control signal according to the present invention.
Figure 8:
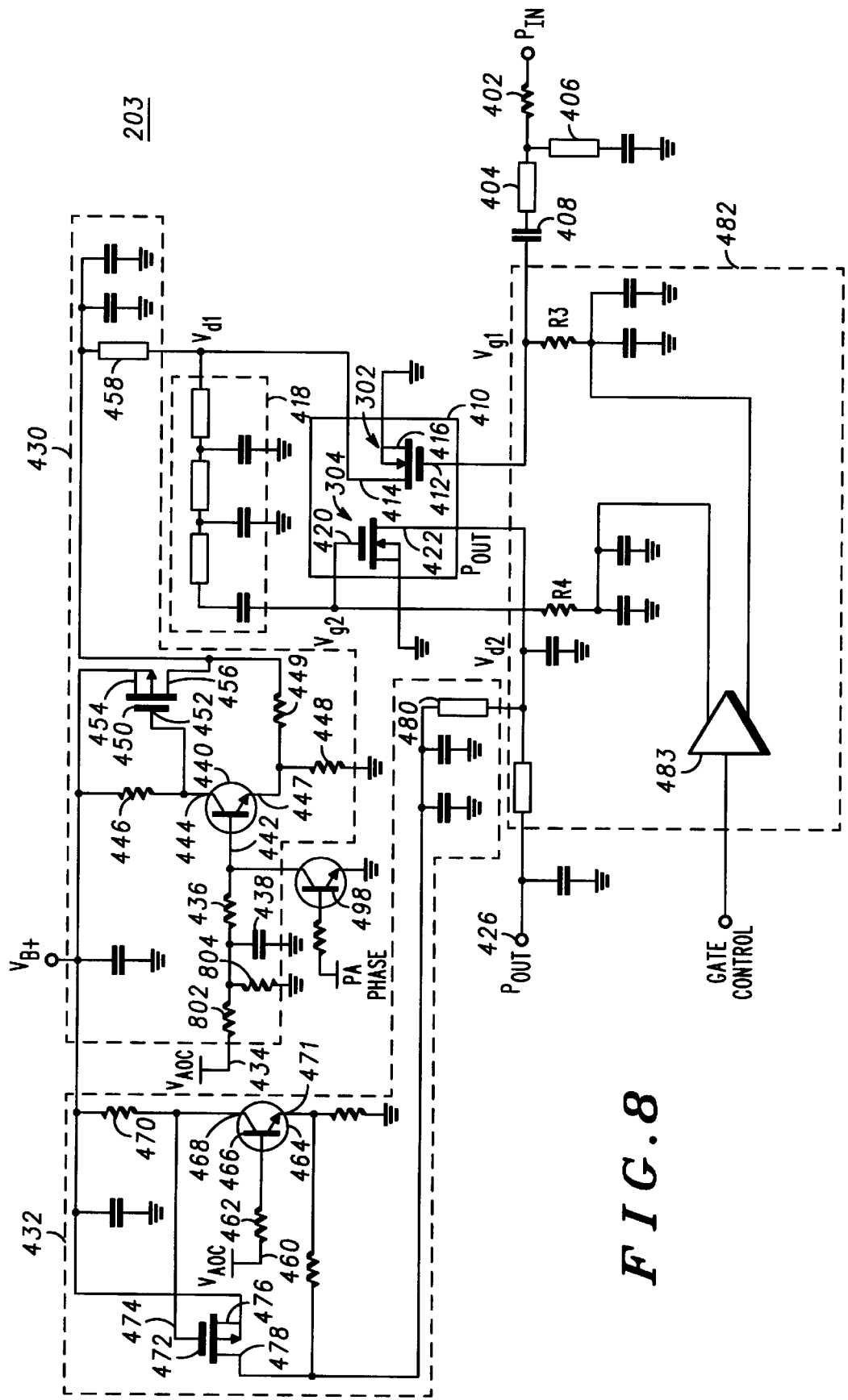
FIG. 8 is a circuit diagram of another alternate embodiment of amplifying circuitry 203.

Turning now to FIG. 8, another alternate embodiment shows a circuit for reducing current in a power amplifier. In particular, the embodiment of FIG. 8 shows a resistor divider network comprising resistors 802 and 804 at the base of control transistor 440. The resistor divider network delays the generation of $V_{d1}$ until the power control signal $V_{AOC}$ reaches a certain level V', as shown in FIG. 9. The circuit then exhibits dual drain control between V' and V", and single drain control between V" and V'". Other circuits could be employed to vary the $V_{d1}$ and $V_{d2}$ curves as a function of $V_{AOC}$ as desired.

Figure 10:
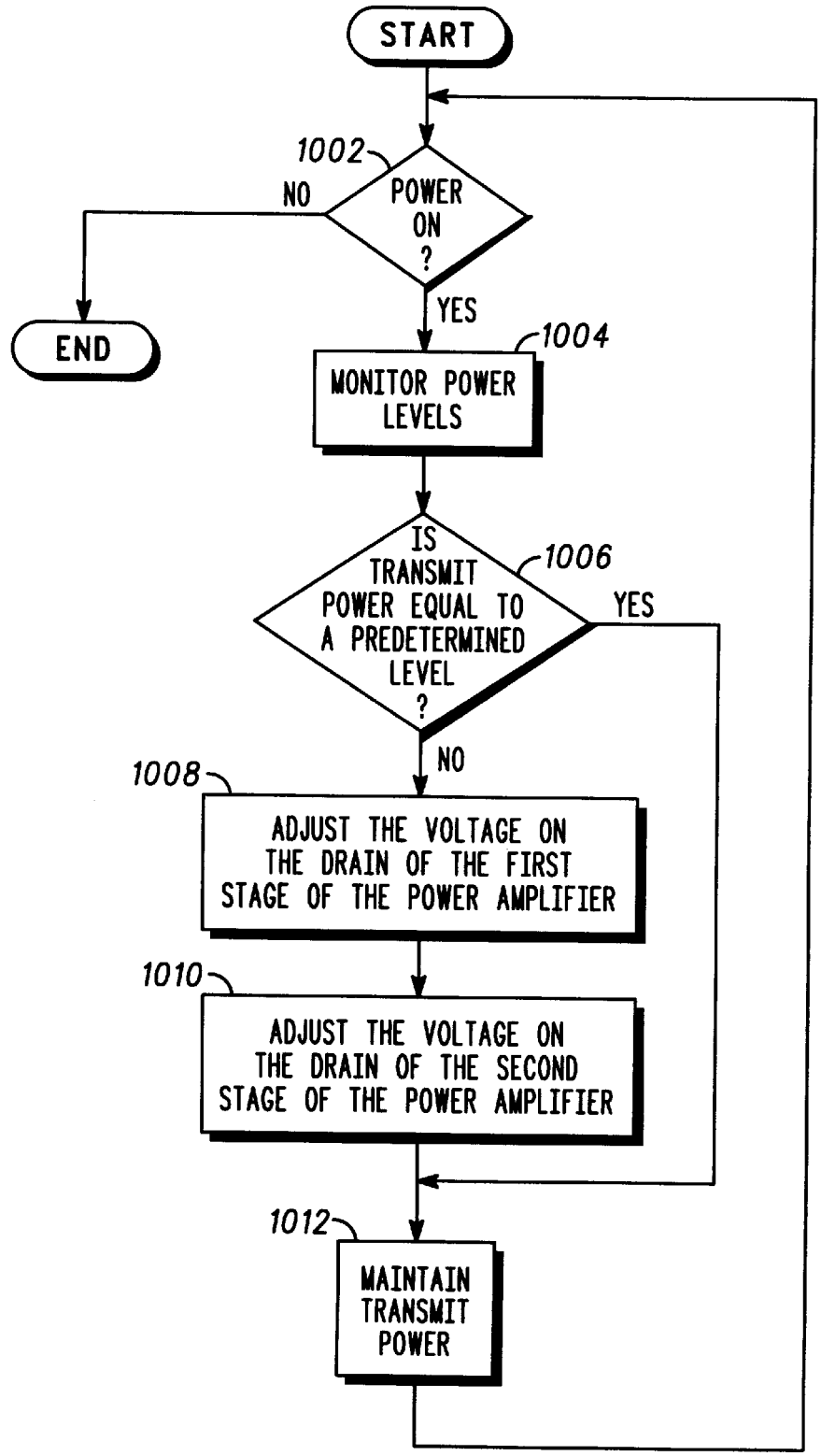
FIG. 10 is a flow chart showing a method for amplifying a signal according to the present invention.

Turning now to FIG. 10, the preferred steps for maximizing the efficiency of the power amplifier according to a first embodiment is shown. Preferably, the microprocessor 103 or other processing circuitry perform the required steps for maximizing power efficiency. In particular, the communication device determines whether power has been applied at a step 1002. The communication device then monitors the power levels for transmission at a step 1004. The communication device then determines whether the transmit power is equal to predetermined level at a step 1006. If the transmit power is equal to the predetermined level as determined by the microprocessor.

If the transmit power is not equal to the predetermined level, the communication device adjusts the voltage on the drain of the first stage of the power amplifier at a step 1008. The device also adjusts the voltage on the drain of the second stage of the power amplifier at a step 1010. The adjustment of the voltage on the drains can be achieved by applying the power control signal $V_{AOC}$ in the circuit of FIGS. 3 or 4. Preferably, the steps of adjusting the voltage on the drains in steps 1008 and 1010 are performed simultaneously, although different voltages may be applied. Further, the voltages could be varied by directly applying a signal from a microprocessor to the drains, or according to the circuits of FIGS. 4, 6 or 8. The communication device then maintains the transmit power of the RF signal at a step 1012 until the transmit power is above a predetermined level at step 1006.

Turning now to FIG. 11, the preferred steps according to an alternate embodiment for maximizing the efficiency of the power amplifier are shown. Such steps are preferably performed in a circuit having gate control, such as that described in reference to FIG. 6. Preferably, the microprocessor 103 or other processing circuitry perform the required steps for maximizing power efficiency. The communication device determines whether power is applied at a step 1102. The communication device monitors the power level at a step 1104. In addition, the communication device adjusts the gate voltage of the second stage according the alternate embodiment of FIG. 11. The communication device determines whether the transmit power is below a predetermined level at a step 1106. If the transmit power is not below a predetermined level, the communication device applies a high power bias to the gate of the second stage of the transistor at a step 1108. If the transmit power is below a predetermined level at step 1108, the communication device applies a low power bias to the gate of the second stage of the transistor at a step 1110 to reduce current consumption.

The communication device then determines whether the transmit of power is equal to a predetermined level at a step 1106. If the transmit power is equal to the predetermined level as determined by the microprocessor. If the transmit power is not equal to a predetermined level, the communication device provides a first voltage to the drain of the first stage of the power amplifier at a step 1108, and provides a second voltage to the drain at second stage of the power amplifier at a step 1110. Preferably, the steps of adjusting the voltage on the drains in steps 1108 and 1110 are performed simultaneously, although different voltages may be applied, as described in detail in reference to FIG. 6. The first and second voltage is preferably determined by the design of the circuit, such as the circuit in FIG. 6. The first and second voltages are determined by a number of factors, including the power amplifier transistors, etc. Finally, the communication device maintains the transmit power of the RF signals at a step 1118.

In summary, the method and apparatus set forth in the present disclosure describes dual drain control using a variable voltage supply on the drains of the first and second stages to control the output power. Dual drain control provides the dynamic range necessary for the transmission of low power levels, such as power levels 8, 9 and 10 of the IS-91 standard. While dual drain control having a 1:1 ratio (i.e. ratio of voltages applied to the drains) is efficient at low power levels, dual drain control having a 1:1 ratio is generally less efficient at high power levels than single drain control. Accordingly, dual drain control having a 1:1 ratio at lower power levels, with single drain control at higher power levels is preferably employed. Such dual drain control could be employed by directly varying the voltage on the drains of the power amplifier, such as with signals from a microprocessor. Alternatively, specific circuits could be employed to generate the drain voltages based upon a control voltage. Such circuits using a control voltage would reduce the number of control signals from the microprocessor. For example, a circuit could emulate dual drain control up to a predetermined power level, with single drain control above that power level. According to an alternate embodiment, dual drain control having a lower ratio, such as a 1:3 ratio, could be employed with an alternate low power bias applied to the gate of the second stage. The alternate low power bias is chosen to optimize efficiency and stability of the amplifier.

Although the invention has been described and illustrated in the above description and drawings, it is understood that this description is by way of example only and that numerous changes and modifications can be made by those skilled in the art without departing from the true spirit and scope of the invention. Although the present invention finds particular application in portable cellular radiotelephones, the invention could be applied to any wireless communication device, including pagers, electronic organizers, or computers. Applicants' invention should be limited only by the following claims.

We claim:

1. An apparatus for amplifying a signal comprising:
a first field effect transistor having a first gate for receiving an input RF signal and a first drain for generating an amplified RF signal;
a second field effect transistor having second gate coupled to said first drain for receiving said amplified RF signal, and a second drain for generating an outputted RF signal; and
a control circuit coupled to said first drain and said second drain for varying voltages applied to said first drain and said second drain based upon an output power for said apparatus, wherein said control circuit has dual drain control up to a predetermined power level and single drain control above the predetermined power level.

2. The apparatus for amplifying a signal of claim 1 wherein control circuit applies a first drain voltage to said first drain and a second drain voltage to said second drain.

3. The apparatus for amplifying a signal of claim 1 wherein control circuit comprises a microprocessor for directly applying a first drain voltage and a second drain voltage to said first drain and said second drain, respectively.

4. The apparatus for amplifying a signal of claim 3 wherein said first drain voltage and said second drain voltage are substantially the same up to a predetermined output power for said apparatus and wherein said second drain voltage is substantially fixed above said predetermined output power.

5. The apparatus for amplifying a signal of claim 1 wherein said control circuit comprises a circuit for generating a first drain voltage and a second drain voltage.

6. The apparatus for amplifying a signal of claim 1 wherein said control circuit comprises a first circuit for generating a first drain voltage in response to a control signal.

7. The apparatus for amplifying a signal of claim 6 wherein said first circuit comprises a first transistor having a first series resistor and a first shunt resistor coupled to an emitter of said first transistor, said first drain voltage being a function of said control signal, said first series resistor and said first shunt resistor.

8. The apparatus for amplifying a signal of claim 6 wherein said control circuit further comprises a second circuit for generating a second drain voltage in response to said control signal.

9. The apparatus for amplifying a signal of claim 8 wherein said second circuit comprises a second transistor having a second series resistor and a second shunt resistor coupled to an emitter of said second transistor, said second drain voltage being a function of said control signal, said second series resistor and said second shunt resistor.

10. The apparatus for amplifying a signal of claim 9 wherein said second circuit further comprises a shunt circuit coupled to receive said control signal, said shunt circuit altering the gain of said second transistor.

11. The apparatus for amplifying a signal of claim 10 wherein said shunt circuit comprises a third transistor coupled to receive said control signal, said third transistor providing a path coupling a third resistor to said second shunt resistor and said second series resistor.

12. An apparatus for amplifying a signal comprising:
a first field effect transistor having a first gate for receiving an input RF signal and a first drain for generating an amplified RF signal;

a second field effect transistor having second gate coupled to said drain for generating an amplified RF signal for receiving said amplified RF signal and a second drain for generating an outputted RF signal; and a control circuit coupled to said first drain and said second drain for applying a first drain voltage to said first drain and a second drain voltage to said second drain depending upon a power control signal for said apparatus, wherein said first drain voltage and said second drain voltage are substantially the same up to a predetermined output power for said apparatus and wherein said second drain voltage is substantially fixed above said predetermined output power.

13. The apparatus for amplifying a signal of claim 12 wherein control circuit comprises a microprocessor for applying said first drain voltage and said second drain voltage to said first drain and said second drain, respectively.

14. The apparatus for amplifying a signal of claim 12 wherein said control circuit comprises a transistor having a series resistor and a shunt resistor coupled to an emitter of said transistor, said second drain voltage being a function of said power control signal, said series resistor and said shunt resistor.

15. The apparatus for amplifying a signal of claim 14 wherein said control circuit further comprises a shunt circuit coupled to receive said control signal, said shunt circuit altering the gain of said second transistor.

16. An apparatus for amplifying a signal comprising:

a first field effect transistor having a first gate for receiving an input RF signal and a first drain for generating an amplified RF signal;

a second field effect transistor having second gate coupled to said first drain for receiving said amplified RF signal and a second drain for generating an outputted RF signal;

a first circuit for generating a first drain voltage in response to a control signal;

a second circuit for generating a second drain voltage in response to said control signal; and wherein said first drain voltage and said second drain voltage are substantially the same up to a predetermined output power for said apparatus and wherein said second drain voltage is substantially fixed above said predetermined output power.

17. The apparatus for amplifying a signal of claim 16 wherein said first circuit comprises a first transistor having a first series resistor and a first shunt resistor coupled to an emitter of said first transistor, said first drain voltage being a function of said control signal, said first series resistor and said first shunt resistor.

18. The apparatus for amplifying a signal of claim 16 wherein said second circuit comprises a second transistor having a second series resistor and a second shunt resistor coupled to an emitter of said second transistor, said second drain voltage being a function of said control voltage, said second series resistor and said second shunt resistor.

19. The apparatus for amplifying a signal of claim 18 wherein said second circuit further comprises a shunt circuit coupled to receive said control signal, said shunt circuit altering the gain of said second transistor.

20. The apparatus for amplifying a signal of claim 19 wherein said shunt circuit comprises a third transistor coupled to receive said control signal, said third transistor providing a path coupling a third resistor to said second shunt resistor and said second series resistor.

21. An apparatus for amplifying a signal comprising:

a first field effect transistor having a first gate for receiving an input RF signal and a first drain for generating an amplified RF signal;

a second field effect transistor having second gate coupled to said first drain for generating an amplified RF signal for receiving said amplified RF signal and a second drain for generating an outputted RF signal;

a first circuit coupled to the first drain for generating a first drain voltage in response to a control signal, said first circuit having a first transistor having a first series resistor and a first shunt resistor coupled to an emitter of said first transistor, said first drain voltage being a function of said control signal, said first series resistor and said first shunt resistor;

a second circuit coupled to the second drain for generating a second drain voltage in response to said control signal, wherein said second circuit comprises a second transistor having a second series resistor and a second shunt resistor coupled to an emitter of said second transistor, said second drain voltage being a function of said control signal, said second series resistor and said second shunt resistor; and a shunt circuit comprises a third transistor coupled to receive said control signal, said third transistor providing a path coupling a third resistor to said second shunt resistor and said second series resistor, said shunt circuit altering the gain of said second transistor such that said first drain voltage and said second drain voltage are the same up to a predetermined output power for said apparatus and wherein said second drain voltage is fixed above said predetermined output power.

22. A method of amplifying a signal, comprising:

coupling an input signal to a first stage of a power amplifier;

varying a voltage applied to a drain of the first stage of the power amplifier by applying a voltage which increases substantially linearly until the output power level has reached a first predetermined level;

varying a voltage applied to a drain of a second stage of the power amplifier to exhibit a single drain control and a dual drain control depending upon the power level of the power amplifier; and generating an output signal at an output which is an amplified version of an input signal received at an input of said power amplifier.

23. The method of amplifying a signal of claim 22 wherein said step of varying a voltage applied to said second stage of said power amplifier comprises applying a voltage which increases substantially linearly until the output power level has reached a second predetermined level which is lower than said first predetermined level.

24. The method of amplifying a signal of claim 23 wherein said step of varying a voltage applied to said second stage of said power amplifier comprises applying a voltage which substantially the same as the voltage applied to said first stage below said second predetermined level.

25. The method of amplifying a signal of claim 24 wherein said step of varying a voltage applied to said second stage of said power amplifier comprises applying a voltage which is substantially fixed above said second predetermined level.

26. A method of amplifying a signal comprising:

coupling an input signal to a first stage of a power amplifier; applying a first voltage to a drain of the first stage of said power amplifier;

applying a first voltage to a drain of a second stage of said power amplifier until a power control voltage reaches a predetermined level;

applying a second voltage to said drain of said second stage of said power amplifier after said power control voltage reaches said predetermined level;

generating an output signal at an output which is an amplified version of an input signal received at said first stage of said power amplifier; and wherein applying a first voltage and applying a second voltage exhibits a single drain control and a dual drain control depending upon the power level of the power amplifier.

27. A method of amplifying a signal comprising:

coupling an input signal to a first stage of a power amplifier;

applying a first voltage to a drain of said first stage of said power amplifier, wherein said first voltage increases substantially linearly until a power control voltage of said power amplifier has reached a predetermined level;

applying a second voltage to a drain of a second stage of said power amplifier until said power control voltage reaches said predetermined level, wherein said second voltage increases substantially linearly until said output power level has reached said predetermined level;

applying a substantially fixed voltage to said drain of said second stage of said power amplifier when said output power level is above said predetermined level; and generating an output signal at an output which is an amplified version of an input signal received at said first stage of said power amplifier.

28. The method of amplifying a signal of claim 27 wherein said first voltage and said second voltage are substantially the same below said predetermined level.

\* \* \* \* \*

UNITED STATES PATENT AND TRADEMARK OFFICE
CERTIFICATE OF CORRECTION

PATENT NO. : 6,025,753
DATED : February 15, 2000
INVENTOR(S) : Landherr, Michael et al.

It is certified that error appears in the above-indentified patent and that said Letters Patent is hereby corrected as shown below:

Claim 8, line 1:

Please replace "claim 6" with --claim 7--.

Signed and Sealed this

Second Day of January, 2001

Attest:

Q. TODD DICKINSON

*Attesting Officer*      *Commissioner of Patents and Trademarks*